United States Patent
Ni et al.

(10) Patent No.: US 10,634,966 B2
(45) Date of Patent: Apr. 28, 2020

(54) DISPLAY SUBSTRATE, DISPLAY PANEL, METHOD FOR FABRICATING THE SAME, DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Huan Ni, Beijing (CN); Fengzhen Lv, Beijing (CN); Qun Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/573,085

(22) PCT Filed: Apr. 1, 2017

(86) PCT No.: PCT/CN2017/079211
§ 371 (c)(1),
(2) Date: Nov. 9, 2017

(87) PCT Pub. No.: WO2018/054031
PCT Pub. Date: Mar. 29, 2018

(65) Prior Publication Data
US 2018/0356697 A1    Dec. 13, 2018

(30) Foreign Application Priority Data

Sep. 23, 2016   (CN) .......................... 2016 1 0844162

(51) Int. Cl.
*H01L 27/12*   (2006.01)
*G02F 1/1362*  (2006.01)
(Continued)

(52) U.S. Cl.
CPC ...... *G02F 1/136209* (2013.01); *G02F 1/1339* (2013.01); *G02F 1/1368* (2013.01);
(Continued)

(58) Field of Classification Search
CPC ............. G02F 1/136209; G02F 1/1339; G02F 1/1368; G02F 2001/136222; H01L 27/1214
See application file for complete search history.

(56) References Cited

U.S. PATENT DOCUMENTS

2004/0235974 A1* 11/2004 Lai ........................... G02B 1/04
                                                                    522/2
2005/0185128 A1*  8/2005 Yeh ....................... G02F 1/1339
                                                                  349/153
(Continued)

FOREIGN PATENT DOCUMENTS

CN   101078840 A   11/2007
CN   202533683 U   11/2012
(Continued)

OTHER PUBLICATIONS

Office Action received for Chinese Patent Application No. 201610844162.2, dated Feb. 27, 2018, 15 pages (8 pages of English Translation and 7 pages of Office Action).
(Continued)

*Primary Examiner* — Fernando L Toledo
*Assistant Examiner* — Neil R Prasad
(74) *Attorney, Agent, or Firm* — Womble Bond Dickinson (US) LLP (57) ABSTRACT

A display substrate is disclosed, comprising a display area and a peripheral area surrounding the display area. The display substrate is fixed to a counter substrate in the peripheral area by a frame sealant. The display substrate
(Continued)

comprises a substrate and a curing energy transmissive layer. A projection of the frame sealant on the substrate falls within or coincides with that of the curing energy transmissive layer. Since the curing energy transmissive layer transparent for the curing energy beam is provided in the display substrate, the frame sealant can be irradiated from the display substrate side through the curing energy transmissive layer, instead of from the counter substrate side. This improves the efficiency for curing the frame sealant. A display panel, a method for fabricating the display substrate and the display panel, and a display device are disclosed.

20 Claims, 4 Drawing Sheets (51) Int. Cl.
G02F 1/1368 (2006.01)
G02F 1/1339 (2006.01)
G02F 1/1333 (2006.01)
(52) U.S. Cl.
CPC .................. *H01L 27/1214* (2013.01); *G02F 2001/133388* (2013.01); *G02F 2001/136222* (2013.01); *G02F 2202/023* (2013.01)

(56) References Cited

U.S. PATENT DOCUMENTS

| 2007/0273821 | A1* | 11/2007 | Liou | G02F 1/1339 349/153 |
| 2013/0286331 | A1* | 10/2013 | Chen | G02F 1/1339 349/106 |
| 2014/0036353 | A1* | 2/2014 | Krogdahl | B29C 65/1435 359/350 |
| 2014/0098320 | A1* | 4/2014 | Zhang | G02F 1/133345 349/46 |
| 2015/0160485 | A1 | 6/2015 | Li et al. | |
| 2017/0139244 | A1 | 5/2017 | Zhang et al. | |

FOREIGN PATENT DOCUMENTS

| CN | 103777406 A | 5/2014 |
| CN | 104793408 A | 7/2015 |
| CN | 105093626 A | 11/2015 |
| CN | 106154636 A | 11/2016 |
| JP | 2010-266711 A | 11/2010 |

OTHER PUBLICATIONS

International Search Report received for PCT Patent Application No. PCT/CN2017/079211, dated Jul. 5, 2017, 6 pages (2 pages of English Translation and 4 pages of Original Document).

* cited by examiner

DISPLAY SUBSTRATE, DISPLAY PANEL, METHOD FOR FABRICATING THE SAME, DISPLAY DEVICE

RELATED APPLICATIONS

The present application is the U.S. national phase entry of PCT/CN2017/079211, with an international filing date of Apr. 1, 2017, which claims the benefit of Chinese Patent Application No. 201610844162.2, filed on Sep. 23, 2016, the entire disclosures of which are incorporated herein by reference.

TECHNICAL FIELD

The present disclosure relates to the field of display technology, and particularly to a display substrate and a method for fabricating the same, a display panel and a method for fabricating the same, and a display device.

BACKGROUND

A liquid crystal display device (LCD) has been widely applied to device like TV, computer, tablet computer and mobile phone, due to its advantages of small volume, low consumption, low heat, and radiation-free. In LCD, a display panel comprises an array substrate and a color film substrate which are arranged oppositely. In a peripheral region, the display panel is provided with a frame sealant for adhering the array substrate and the color film substrate and sealing a liquid crystal layer. Generally, after coating the frame sealant on the color film substrate, UV light is applied to cure the frame sealant, to complete the assembling of the array substrate and the color film substrate. The color film substrate is generally provided with a black matrix at a region corresponding to the frame sealant, and UV light cannot transmit the black matrix. Thus, it is necessary to irradiate from the array substrate side. This leads to a low curing efficiency of the frame sealant, affects the assembling effect of the array substrate and the color film substrate, and further affects the display effect and lifetime.

SUMMARY

An embodiment of the present disclosure provides a display substrate. The display substrate comprises a display area and a peripheral area surrounding the display area. The display substrate is fixed to a counter substrate in the peripheral area by a frame sealant. The display substrate comprises a substrate and a curing energy transmissive layer which is arranged on the substrate. A projection of the frame sealant on the substrate falls within or coincides with a projection of the curing energy transmissive layer on the substrate.

In the display substrate of this embodiment, since the curing energy transmissive layer transparent for the curing energy beam is provided in the display substrate, the frame sealant can be irradiated with the curing energy beam from the display substrate side through the curing energy transmissive layer, instead of from the counter substrate side. This improves the efficiency for the curing energy beam to cure the frame sealant, and thus improves the display effect and lifetime. It is noted that the terms "display substrate" and "counter substrate" as used herein refer to two substrates which are assembled to form a display panel, and do not intend to define the function or role of these two substrates. Therefore, these two terms generally can be used interchangeably. For example, any one of the two substrates of the display panel can be referred to as a display substrate, and the other one a counter substrate.

In an embodiment of the present disclosure, the display substrate further comprises a light shielding component which is arranged in the peripheral area of the substrate; and a projection of the light shielding component on the substrate does not overlap the projection of the frame sealant on the substrate.

In the display substrate of this embodiment, the light shielding component prevents visible light leakage of the display substrate to improve the display effect, and does not hinder the curing energy beam to irradiate the frame sealant. As described below, the light shielding component is a light shielding frame or a black matrix.

In an embodiment of the present disclosure, the light shielding component and the curing energy transmissive layer are arranged on a surface of the substrate facing the counter substrate.

In the display substrate of this embodiment, both the light shielding component and the curing energy transmissive layer are arranged on a surface of the display substrate facing the counter substrate, for purpose of preventing light leakage of the display substrate, which facilitates improving the display effect.

In an embodiment of the present disclosure, the light shielding component is a light shielding frame.

In the display substrate of this embodiment, the light shielding frame is an independent component which is made from a material opaque for the visible light, and then attached to the display substrate during its fabrication. Due to the light shielding frame, there is no need for complicated film forming or patterning processes or steps. This facilitates simplifying process, reducing tact time, and reducing production cost of the display substrate.

In an embodiment of the present disclosure, the light shielding component is a black matrix.

In the display substrate of this embodiment, since the existing display substrate generally adopt a black matrix, the display substrate of the present disclosure is compatible with the existing display substrate, so that the modification to the existing display substrate and its fabricating method is minimized.

In an embodiment of the present disclosure, the black matrix is provided with an opening part; and the curing energy transmissive layer fills up the opening part.

In the display substrate of this embodiment, the black matrix and the curing energy transmissive layer have complementary shapes, the black matrix effectively inhibits light leakage to ensure display effect, and the curing energy transmissive layer effectively transmits the curing energy beam to improve curing effect of the frame sealant.

In an embodiment of the present disclosure, the curing energy transmissive layer comprises a material which is transparent for UV light.

In the display substrate of this embodiment, the curing energy transmissive layer is transparent for UV light, thus allowing the UV light to transmit through the curing energy transmissive layer to realize UV curing (i.e., light curing). The term "transparent" as used herein refers to a transmittance of ≥60%, ≥75%, ≥90% or even 100%. The UV light has a wavelength in a range of for example 100-400 nm, for example 250-380 nm. The UV light has a wavelength of for example 254 nm, 313 nm, 365 nm or the like.

In an embodiment of the present disclosure, the curing energy transmissive layer comprises a material which is transparent for infrared light.

In the display substrate of this embodiment, the curing energy transmissive layer is transparent for infrared light, thus allowing infrared light to transmit through the curing energy transmissive layer for infrared curing (i.e., thermal curing). The infrared light has a wavelength in a range of for example 0.75-500 µm, for example 1.064 µm produced by a Nd:YAG laser device, 10.6 µm produced by a $CO_2$ laser device, or the like.

In an embodiment of the present disclosure, the curing energy transmissive layer comprises a material which converts an incident energy beam into a curing energy beam.

In the display substrate of this embodiment, the curing energy transmissive layer comprises a wavelength converting material, which converts the incident energy beam into the curing energy beam for curing the frame sealant. For example, the wavelength converting material comprises a host and rare earth ions doped in the host. The wavelength converting material (frequency) up-converts or down-converts the incident energy beam to produce curing energy beam of such as UV light or infrared light for curing the frame sealant. The host for example is one or mixture of fluoride, oxide, chalcogenide, oxyfluoride, halide. The rare earth ions comprise one or more of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutecium (Lu), scandium (Sc), and yttrium (Y) ions.

In an embodiment of the present disclosure, the curing energy transmissive layer comprises a material which converts an incident energy beam into a long wavelength energy beam for curing the frame sealant.

In the display substrate of this embodiment, the wavelength converting material in the curing energy transmissive layer is a down-converting material which down-converts the incident energy beam. For example, the down-converting material converts UV light into infrared light according to the Stokes effect. In this way, a single UV light source is used to realize light curing and thermal curing simultaneously, and it is not necessary to provide a separate infrared light source. In one example, the down-converting material is LaNdYbOF:Nd3+, Yb3+, which emits infrared light of 950~1100 nm when excited by a 353 nm laser. The expression "long wavelength" as used herein refers to a wavelength of the converted energy beam which is longer than the incident energy beam.

In an embodiment of the present disclosure, the curing energy transmissive layer comprises a material which converts an incident energy beam into a short wavelength energy beam for curing the frame sealant.

In the display substrate of this embodiment, the wavelength converting material in the curing energy transmissive layer is an up-converting material which up-converts the incident energy beam. For example, the up-converting material converts infrared light into UV light according to the anti-Stokes effect. In this way, a single infrared light source is used to realize both light curing and thermal curing, and it is not required to provide a separate UV light source. In one example, the up-converting material is YGdYbHoO:$Gd^{3+}$, which emits UV light at 309 nm and 315 nm when excited by infrared light of 976 nm. In one example, the up-converting material is $NaYF_4:Er^{3+}$, which emits UV light of 310 nm and 340 nm when excited by green light. In one example, the up-converting material is $YF_3:Yb^{3+}$, which emits green light at 500 nm. In one example, the up-converting material is a fluoride host which is co-doped with two or more rare earth ions, e.g., $YF_3:Tm^{3+}$, $Yb^{3+}$ and $YF_3:Tm^{3+}$, $Yb^{3+}$, $Nd^{3+}$, which is excited by laser at 796 nm to emit UV and blue light. The expression "short wavelength" as used herein refers to the converted energy beam has a wavelength shorter than the incident energy beam.

An embodiment of the present disclosure provides a display panel, comprising the display substrate as described above; and a counter substrate, wherein the counter substrate is assembled with the display substrate by the frame sealant.

The display panel of this embodiment of the present disclosure has the same or similar beneficial effects as various embodiments of the display substrate as described above, which are not repeated herein for simplicity.

In an embodiment of the present disclosure, the display substrate further comprises a color filter layer which is arranged on the substrate.

In the display panel of this embodiment, the display substrate comprises a color filter layer, and the counter substrate comprises a thin film transistor layer. Namely, the display substrate is the color film substrate and the counter substrate is the array substrate. In case the curing energy transmissive layer is applied to the color film substrate, the frame sealant can be irradiated with the curing energy beam from the color film substrate side through the curing energy transmissive layer, instead of from the array substrate side. This improves the efficiency for the curing energy beam to cure the frame sealant, and thus improves the display effect and lifetime.

In an embodiment of the present disclosure, the counter substrate further comprises a color filter layer which is arranged on the substrate.

In the display panel of this embodiment, the counter substrate comprises a thin film transistor layer and a color filter layer. Namely, the counter substrate is a Color Filter On Array (COA) substrate. The curing energy transmissive layer is applied to the display substrate to which the COA substrate is to be assembled, so that the frame sealant can be irradiated with the curing energy beam from the display substrate side through the curing energy transmissive layer, instead of from the COA substrate side. This improves the efficiency for the curing energy beam to cure the frame sealant, and thus improves the display effect and lifetime.

An embodiment of the present disclosure provides a display device, comprising the display panel as described above.

The display panel and display device of embodiments of the present disclosure have the same or similar beneficial effects as those of the display substrate as described above, which are not repeated herein for simplicity.

An embodiment of the present disclosure provides a method for fabricating a display substrate. The display substrate comprises a display area and a peripheral area and is fixed to a counter substrate in the peripheral area by a frame sealant. The method comprises steps of: preparing a substrate; and forming a curing energy transmissive layer in the peripheral area of the substrate, wherein a projection of the frame sealant on the substrate falls within or coincides with a projection of the curing energy transmissive layer on the substrate.

In an embodiment of the present disclosure, the step of forming the curing energy transmissive layer comprises: forming a black matrix on the substrate; forming an opening part in the black matrix by a patterning process; coating a dye in the opening part; and drying the dye to form the curing energy transmissive layer.

In an embodiment of the present disclosure, the step of forming the curing energy transmissive layer comprises: forming a black matrix on the substrate; forming an opening part in the black matrix by a patterning process; and forming the curing energy transmissive layer in the opening part by deposition.

An embodiment of the present disclosure provides a method for fabricating a display panel. The display panel comprises a display area and a peripheral area. The method comprises steps of: forming a curing energy transmissive layer in the peripheral area of a substrate of the display substrate; coating a frame sealant on the display substrate or the counter substrate, wherein a projection of the frame sealant on the substrate falls within or coincides with a projection of the curing energy transmissive layer on the substrate; and assembling the display substrate with the counter substrate and curing the frame sealant.

The method for fabricating a display substrate and the method for fabricating a display panel of embodiments of the present disclosure have the same or similar beneficial effects as those of the display substrate as described above, which are not repeated herein for simplicity.

It is understood that the general description as described above and the detailed description as described hereinafter are only exemplary and explanatory, and do not intend to limit the present disclosure in any manner. Embodiments of the present disclosure are directed to all possible combinations of features recited in the claims.

BRIEF DESCRIPTION OF THE DRAWINGS

In order to explain the technical solutions in the embodiments of the present disclosure more clearly, the drawings to be used in the description of the embodiments will be introduced briefly in the following. Apparently, the drawings described below are only some embodiments of the present disclosure.

Explicit embodiments of the present disclosure have been shown in the above drawings, and these embodiments will be described in detail hereinafter. These drawings and literal description do not intend to limit the protection scope of the present disclosure, but to elucidate concepts of the present disclosure for a person with ordinary skill in the art by referring to specific embodiments.

DETAILED DESCRIPTION OF EMBODIMENTS

To make the objects, the technical solutions and the advantages of embodiments of the present disclosure more apparent, the technical solutions of the embodiments of the present disclosure will be described in detail hereinafter in conjunction with the drawings of the embodiments of the present disclosure.

REFERENCE NUMERALS 1, 2, 3 display panel;
110, 210, 310 counter substrate;
111, 211, 311 first substrate;
112, 212, 312 thin film transistor layer;
120, 220, 320 frame sealant;
130, 230, 330 display substrate;
131, 231, 331 second substrate;
132, 232, 313, 332 color filter layer;
133, 233, 314 black matrix;
140, 240, 340 liquid crystal layer;
250, 350 curing energy transmissive layer;
160, 260, 360, 360' curing energy beam; and
AA display area.

Figure 1A:
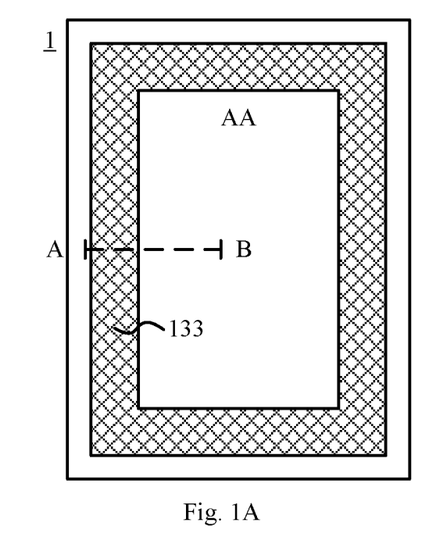
FIG. 1A is a top view for illustrating a display panel.
Figure 1B:
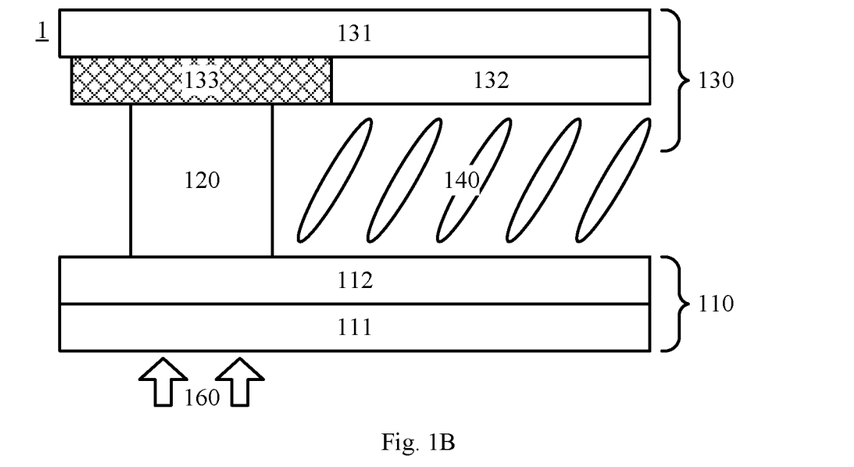
FIG. 1B is a cross-sectional view along a line A-B in FIG. 1A.

FIG. 1A schematically shows a top view of a display panel, and FIG. 1B schematically shows a cross-sectional view of the display panel. As shown, the display panel 1 comprises a counter substrate 110, a display substrate 130, and a liquid crystal layer 140 sandwiched therebetween. The counter substrate 110 generally comprises a first substrate 111 and a thin film transistor layer 112 which is arranged on the first substrate 111. Namely, the counter substrate 110 acts as an array substrate in this case. The display substrate 130 generally comprises a second substrate 131, and a color filter layer 132 and a black matrix 133 which are arranged on a surface of the second substrate 131 facing the counter substrate 110. Namely, the display substrate 130 acts as a color film substrate in this case. The black matrix 133 is arranged in a peripheral area of the display panel 1, and surrounds a display area AA of the display panel 1. The display substrate 130 and the counter substrate 110 are assembled by a frame sealant 120.

The frame sealant 120 is generally coated on the color film substrate 130, and then pre-cured by a curing energy beam 160 such as UV light. This prevents the liquid crystal which is dropped subsequently from diffusing to the region covered by the frame sealant 120, from contacting the frame sealant 120 which has not been cured, and thus from being polluted. Since the black matrix 133 shields UV light, it is required to irradiate a UV light 160 from a surface of the display panel 1 facing the array substrate 110. The array substrate 110 generally comprise metal wirings (not shown), and these metal wirings may partially block UV light, so that the efficiency for the UV light to curie the frame sealant 120 is low.

In case the metal wirings near the frame sealant 120 in the array substrate 110 are formed thinner or formed into a mesh shape, a transmission efficiency of the UV light 160 is improved, and the curing efficiency of the frame sealant 120 is thus improved. However, this leads to degradation in the electrically conductive performance of metal wirings, and thus negatively affects electrical property of the display panel 1.

In case the UV light 160 is irradiated from the array substrate 110 side, a significant portion of the UV light 160 will be absorbed by the array substrate 110 and thus wasted, and after absorbing the UV light, the array substrate 110 is subject to a rise in temperature. This reduces the viscosity of the frame sealant 120, and thus causes an assembling defect between the array substrate 110 and the color film substrate 130. As a result, liquid crystal is leaked from the liquid crystal cell or ambient moisture intrudes into the liquid crystal cell, which results in display defects such as non-uniform display brightness.

When the display panel 1 adopts a narrow bezel design, the peripheral area and the frame sealant 120 which is arranged in the peripheral area become narrower. In this case, the effect of reduction in viscosity of the frame sealant 120 is serious.

The array substrate 110 transmits the UV light 160 in a non-uniform way, so that the UV light 160 impinging on the frame sealant 120 has a non-uniform intensity, and irradiation dose may be insufficient at some local position. This possibly results in insufficient hardening and even even contaminating of the frame sealant 120, which causes display defects.

To this end, according to an embodiment of the present disclosure, a display substrate is provided, which comprises a display area and a peripheral area surrounding the display area. The display substrate is fixed to a counter substrate in the peripheral area by a frame sealant. The display substrate comprises a substrate and a curing energy transmissive layer which is arranged on the substrate. A projection of the frame sealant on the substrate falls within or coincides with a projection of the curing energy transmissive layer on the substrate.

The expression "curing energy transmissive layer" as used herein refers to a material layer which allows the curing energy beam to transmit therethrough. For example, this material layer allows 60% or more, 75% or more, 90% or more, or even 100% of the curing energy beam to transmit through the material layer. By arranging the curing energy transmissive layer which is transparent for the curing energy beam in the display substrate, the frame sealant can be irradiated with the curing energy beam from the display substrate side through the curing energy transmissive layer, instead of from the counter substrate side. This improves the efficiency for the curing energy beam to cure the frame sealant, and thus improves the display effect and lifetime.

Figure 2A:
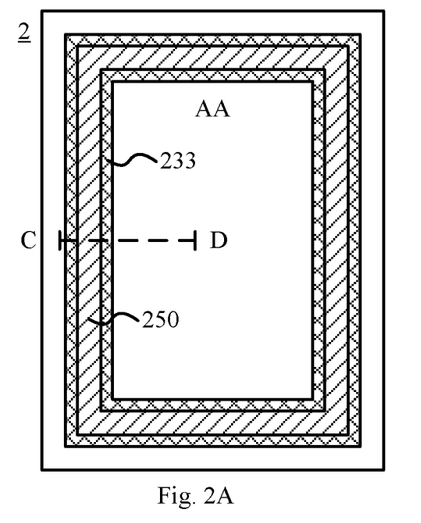
FIG. 2A is a top view for illustrating a display panel in an embodiment of the present disclosure.
Figure 2B:
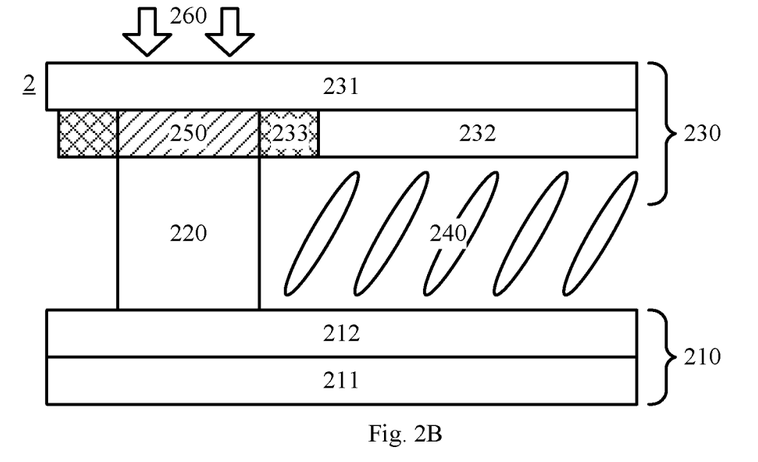
FIG. 2B is a cross-sectional view along a line C-D in FIG. 2A.

As shown in FIG. 2A and FIG. 2B, in an exemplary embodiment, a display panel 2 comprises a counter substrate 210, a display substrate 230, and a liquid crystal layer 240 sandwiched therebetween. The counter substrate 210 generally comprises a first substrate 211 and a thin film transistor layer 212 which is arranged on the first substrate 211. The display substrate 230 comprises a second substrate 231 and a color filter layer 232 and a black matrix 233 which are arranged on a surface of the second substrate 231 facing the counter substrate 210. In this case, the counter substrate 210 is an array substrate, and the display substrate 230 is a color film substrate. The display substrate 230 is fixed to the counter substrate 210 by a frame sealant 220.

As shown in FIG. 2B, the display substrate 230 further comprises a curing energy transmissive layer 250 which is arranged on the second substrate 231. A projection of the frame sealant 220 on the second substrate 231 falls within or coincides with a projection of the curing energy transmissive layer 250 on the second substrate 231. Since the display substrate 230 is provided with the curing energy transmissive layer 250 which is transparent for a curing energy beam, as shown in FIG. 2B, the frame sealant 220 is irradiated with a curing energy beam 260 from the display substrate 230 side through the curing energy transmissive layer 250. Namely, it is not necessary to irradiate the curing energy beam 260 from the counter substrate 210 side which comprises the thin film transistor layer 212. This improves the efficiency for the curing energy beam 260 to cure the frame sealant 220.

Similar with the display substrate 130 of FIG. 1A and FIG. 1B, the display substrate 230 comprises a light shielding component 233 which is arranged in the peripheral area of the display panel 2. However, as shown in FIG. 2A and FIG. 2B, a projection of the light shielding component 233 on the second substrate 231 does not overlap the projection of the frame sealant 220 on the second substrate 231. The light shielding component 233 prevents visible light leakage in the display panel 2 to improve display effect. Since the projection of the light shielding component 233 and that of the frame sealant 220 on the second substrate 231 do not overlap, the light shielding component 233 does not interfere with irradiation of the frame sealant 220 with the curing energy beam 260.

As shown in FIG. 2B, the light shielding component 233 and the curing energy transmissive layer 250 are arranged on a surface of the display substrate 230 facing the counter substrate 210. This prevents light leakage in the display panel 2, and thus improves display effect.

In an exemplary embodiment, the light shielding component 233 is a light shielding frame. The light shielding frame is made from a material opaque for visible light. The light shielding frame is an independent component, and is attached to the display substrate during fabrication of the display substrate 230. This is advantageous since the light shielding frame does not require complicated process steps for film forming or patterning.

In an exemplary embodiment, the light shielding component 233 is a black matrix. As known for the skilled in the art, the existing color film substrate generally adopts a black matrix. This indicates that the display substrate 230 of this embodiment can be realized by minor modifications to the existing display substrate.

As shown in FIG. 2A and FIG. 2B, the black matrix 233 is provided with an opening part, and the curing energy transmissive layer 250 fills up the opening part. The curing energy transmissive layer 250 completely fills up the opening part of the black matrix 233, so that the black matrix 233 effectively inhibits light leakage, and the curing energy transmissive layer 250 effectively transmits the curing energy beam to curing the frame sealant 220.

In an embodiment of the present disclosure, the curing energy transmissive layer 250 shows a low transmittance ratio for visible light. For example, the transmittance ratio is lower than 30%, 10%, 1%, or the curing energy transmissive layer 250 even does not transmit visible light. In this way, once applied to the opening part of the black matrix 233, the curing energy transmissive layer 250 effectively blocks visible light leakage, without any negative effect on the display function of the display panel 2.

Figure 3A:
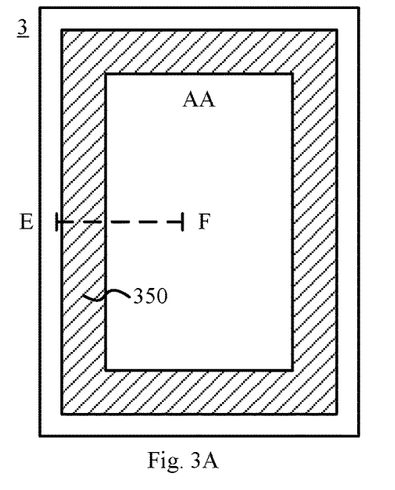
FIG. 3A is a top view for illustrating a display panel in an embodiment of the present disclosure.

In an exemplary embodiment, the curing energy transmissive layer completely replaces the black matrix in existing color film substrate. This will be described hereinafter with reference to FIG. 3A and FIG. 3B. As shown, a display panel 3 comprises a counter substrate 310, a display substrate 330, and a liquid crystal layer 340 sandwiched therebetween. The counter substrate 310 comprises a first substrate 311 and a thin film transistor layer 312 which is arranged on the first substrate 311. The display substrate 330 comprises a second substrate 331 and a color filter layer 332. The display substrate 330 is fixed to the counter substrate 310 by a frame sealant 320.

Figure 3B:
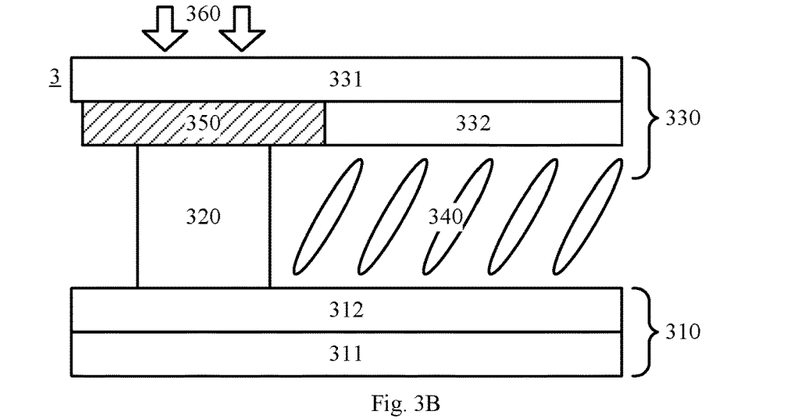
FIG. 3B is a cross-sectional view along a line E-F in FIG. 3A.

In the embodiment shown in FIG. 3B, the display substrate 330 further comprises a curing energy transmissive layer 350 which is arranged on the second substrate 231. For example, a projection of the frame sealant 320 on the second substrate 331 falls within or coincides with a projection of the curing energy transmissive layer 350 on the second substrate 331. The frame sealant 320 is irradiated a curing energy beam 360 from the display substrate 330 side through the curing energy transmissive layer 350. As compared with the display substrate 130 of FIG. 1B, the curing energy transmissive layer 350 in the display substrate 330 completely replaces the black matrix, and thus not only allows the curing energy beam to transmit through, but also defines the display area AA of the display panel 3. As compared with the embodiment shown in FIG. 2B, the display substrate 330 does not comprise a light shielding component like the black matrix, so that the number of components in the display substrate 330 reduces, the structure is simplified, and the cost is reduced.

In embodiments as described above, the curing energy transmissive layer is applied to the color film substrate of the display panel, i.e., a counter substrate to which the array substrate will be assembled. In other embodiments, the curing energy transmissive layer is applied to a counter substrate to which the COA substrate will be assembled, as shown in FIG. 3C.

As for a conventional COA substrate, the counter substrate to which the COA substrate will be assembled generally comprises a light shielding component for defining the display area AA of the display panel. Since the curing energy beam such as UV light cannot transmit through the light shielding component, it is required to irradiate the curing energy beam from the COA substrate. This leads to a low curing efficiency of the frame sealant.

Figure 3C:
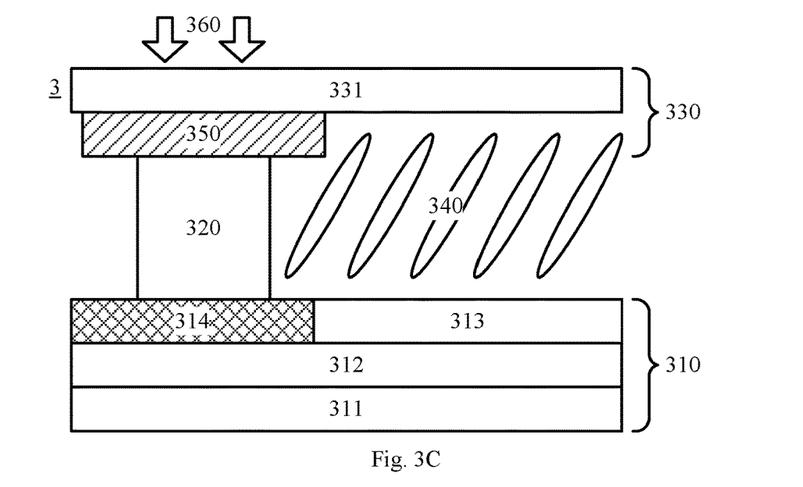
FIG. 3C is a cross-sectional view for illustrating a variant of the display panel shown in FIG. 3B.

In the display panel 3 shown in FIG. 3C, a COA substrate 310 comprises the first substrate 311, the thin film transistor layer 312 which is arranged on the first substrate 311, and the color filter layer 313 and a black matrix 314 which are arranged on the thin film transistor layer 312. The counter substrate 330 comprises the second substrate 331 and the curing energy transmissive layer 350. A projection of the frame sealant 320 on the second substrate 331 falls within or coincides with a projection of the curing energy transmissive layer 350 on the second substrate 331. The curing energy beam 360 irradiates the frame sealant 320 from the counter substrate 330 side through the curing energy transmissive layer 350. As a difference from the embodiment shown in FIG. 3B, the curing energy transmissive layer 350 is arranged on the counter substrate 330 to which the COA substrate 310 will be assembled.

In each of the above embodiments, the first substrate 211, 311 and the second substrate 231, 331 generally are a transparent substrate, like glass or resin.

In each of the above embodiments, the curing energy transmissive layer 250, 350 comprises a material which for example is transparent for UV light, thus allowing UV light to transmit through the curing energy transmissive layer 250, 350 and realize UV curing (i.e., light curing). In alternative embodiments, the curing energy transmissive layer 250, 350 comprises a material which for example is transparent for infrared light, thus allowing infrared light to transmit through the curing energy transmissive layer 250, 350 and realize infrared curing (i.e., thermal curing). The UV light has a wavelength in a range of for example 100-400 nm, and the infrared light has a wavelength in a range of for example 0.75-500 The UV light, the infrared light, and the method for generating the same are known for the person with ordinary skill in the art, which are not repeated here for simplicity.

Figure 3D:
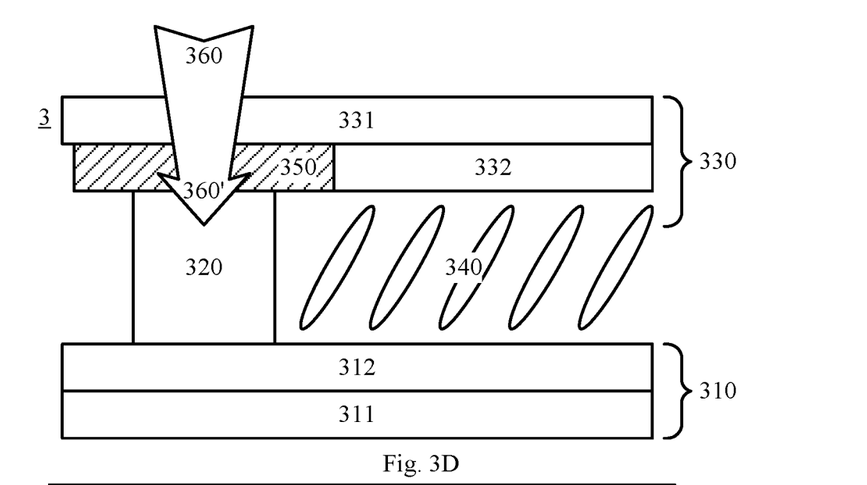
FIG. 3D is a cross-sectional view for illustrating another variant of the display panel shown in FIG. 3B.

As shown in FIG. 3D, in an exemplary embodiment, the curing energy transmissive layer 350 for example comprises a wavelength converting material, which converts an incident energy beam 360 into the curing energy beam 360' for curing the frame sealant. The wavelength converting material comprises a host and rare earth ions which are doped in the host. The host for example is one or a mixture of fluoride, oxide, chalcogenide, oxyfluoride, and halide.

In an exemplary embodiment, the wavelength converting material down-converts the incident energy beam 360, so that the energy beam 360' has a wavelength longer than that of the energy beam 360. For example, the energy beam 360 is UV light, while the energy beam 360' is infrared light. In this way, a single UV light source can be used to realize light curing and thermal curing simultaneously. The wavelength converting material for example is LaNdYbOF:$Nd^{3+}$, $Yb^{3+}$.

In an exemplary embodiment, the wavelength converting material up-converts the incident energy beam 360, so that the energy beam 360' has a wavelength shorter than that of the energy beam 360. For example, the energy beam 360 is infrared light, while the energy beam 360' is UV light. In this way, a single infrared light source is used to realize light curing and thermal curing simultaneously. The wavelength converting material for example is YGdYbHoO:$Gd^{3+}$, NaYF$_4$:$Er^{3-}$, YF$_3$:$Yb^{3+}$, YF$_3$:$Tm^{3+}$, $Yb^{3+}$, YF$_3$:$Tm^{3+}$, $Yb^{3+}$, $Nd^{3+}$, or the like.

In the display substrate 230, 330 as described in each of the above embodiments, the curing energy beam 260, 360 irradiates from the display substrate 230, 330 side which comprises the curing energy transmissive layer 250, 350, instead of from the counter substrate 210, 310 side which comprises the thin film transistor layer 212, 312. Therefore, there is no need to modify metal wirings in the counter substrate 210, 310, so that the electrically conductive performance of these metal wirings is maintained, and the electrical property of the display panel is not affected.

Since the curing energy beam 260, 360 does not irradiate from the counter substrate 210, 310 side, the problem of waste in UV light and rise in temperature due to absorption of curing energy beam (e.g., UV light) by the counter substrate 210, 310 is absent. This improves the utilization efficiency of the curing energy beam. Moreover, this avoids reduction in viscosity of the frame sealant, and ensures good assembly between the display substrate and the counter substrate. Therefore, this effectively prevents liquid crystal from leaking from the liquid crystal cell or ambient moisture from intruding into the liquid crystal cell.

Due to the presence of the curing energy transmissive layer 250, 350, the above display substrate 230, 330 is advantageously applied to a display panel which adopts a narrow bezel design, without any reduction in viscosity of the frame sealant.

Furthermore, the curing energy transmissive layer 250, 350 has a uniform transmittance ratio for the curing energy beam 260, 360, so that the curing energy beam 260, 360 impinging on the frame sealant 220, 320 has a uniform intensity. This facilitates uniformly curing the frame sealant, and realizing strong adhesion between the display substrate and the counter substrate.

In each of the above embodiments, the curing energy beam is UV light or infrared light, for realizing light curing and thermal curing of the frame sealant, respectively. However, embodiments of the present disclosure are not limited in this regard. For example, the curing energy beam is an energy beam in any form or wavelength which is capable of curing the frame sealant.

A method for fabricating a display substrate and a display panel will be described hereinafter, by taking the display panel of FIG. 2B as an example.

Figure 4:
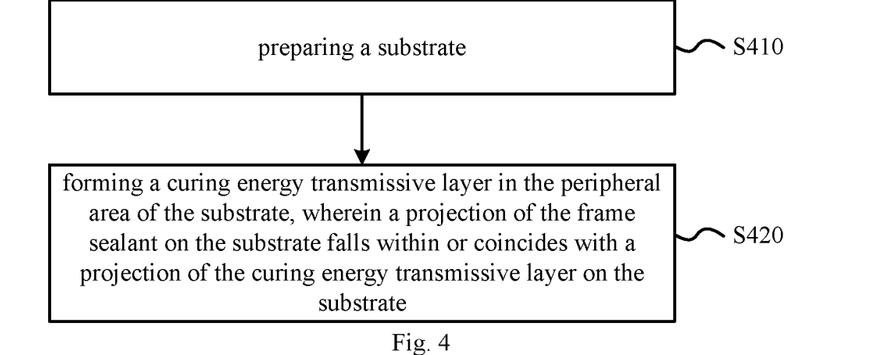
FIG. 4 is a flow chart for illustrating a method for fabricating a display substrate in an embodiment of the present disclosure.

FIG. 4 schematically shows a method for fabricating a display substrate in an embodiment of the present disclosure. The method comprises steps of: S410 preparing a substrate; and S420 forming a curing energy transmissive layer in the peripheral area of the substrate, wherein a projection of the frame sealant on the substrate falls within or coincides with a projection of the curing energy transmissive layer on the substrate.

As shown in FIG. 2B, the display panel 2 comprises the display area AA and the peripheral area, and is fixed to the counter substrate 210 which comprises the thin film transistor layer 212 by the frame sealant 220 in the peripheral area. As shown, the method comprises steps of: preparing the second substrate 231; and forming the curing energy transmissive layer 250 in the peripheral area of the second substrate 231. A projection of the frame sealant 220 on the second substrate 231 falls within or coincides with a projection of the curing energy transmissive layer 250 on the second substrate 231.

For example, the step of forming the curing energy transmissive layer 250 comprises: forming the black matrix 233 on the second substrate 231; forming an opening part in the black matrix 233 by a patterning process; coating a dye in the opening part; and drying the dye to form the curing energy transmissive layer 250.

For example, the step of forming the curing energy transmissive layer 250 comprises: forming the black matrix 233 on the second substrate 231; forming an opening part in the black matrix 233 by a patterning process; and forming the curing energy transmissive layer 250 in the opening part by deposition. Examples for deposition comprise, but are not limited to, CVD, PVD (PECVD), evaporation, sputtering, or the like.

Figure 5:
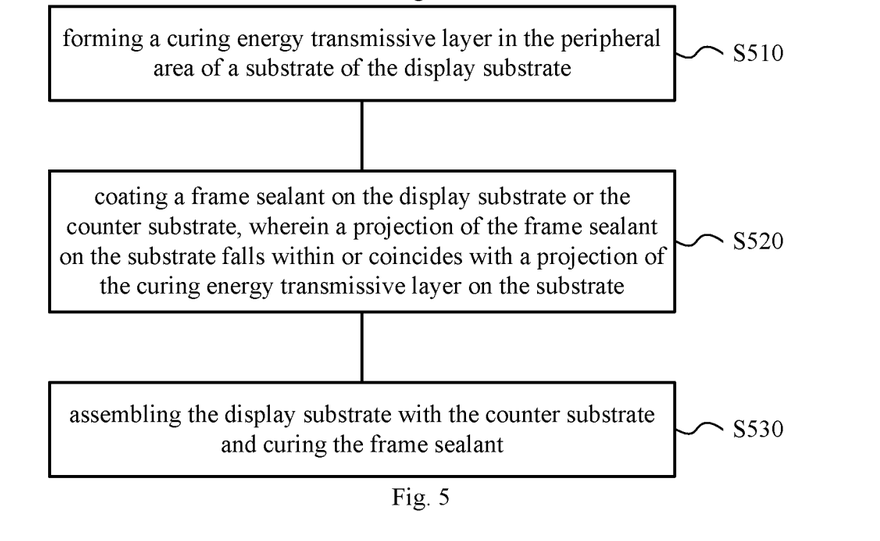
FIG. 5 is a flow chart for illustrating a method for fabricating a display panel in an embodiment of the present disclosure.

FIG. 5 schematically shows a method for fabricating a display panel in an embodiment of the present disclosure. The method comprises steps of: S510 forming a curing energy transmissive layer in the peripheral area of a substrate of the display substrate; S520 coating a frame sealant on the display substrate or the counter substrate, wherein a projection of the frame sealant on the substrate falls within or coincides with a projection of the curing energy transmissive layer on the substrate; and S530 assembling the display substrate with the counter substrate and curing the frame sealant.

As shown in FIG. 2B, the method comprises steps of: forming the curing energy transmissive layer 250 in the peripheral area of the second substrate 231 of the display substrate 230; coating the frame sealant 220 on the display substrate 230 or the counter substrate 210, wherein a projection of the frame sealant 220 on the second substrate 231 falls within or coincides with a projection of the curing energy transmissive layer 250 on the second substrate 231; and assembling the display substrate 230 with the counter substrate 210 and curing the frame sealant 220.

The method for fabricating a display substrate and the method for fabricating a display panel in these embodiments have the same or similar beneficial effects as those of the display substrate as described above, which are not repeated herein for simplicity.

Moreover, on basis of the steps as described in the above embodiments, the person with ordinary skill in the art will know similar steps for fabricating the display substrate shown in other drawings.

Embodiments of the present disclosure disclose a display substrate, a display panel, a method for fabricating the display substrate, a method for fabricating the display panel, and a display device. The display substrate comprises a display area and a peripheral area surrounding the display area. The display substrate is fixed to a counter substrate in the peripheral area by a frame sealant. The display substrate comprises a substrate and a curing energy transmissive layer which is arranged on the substrate. A projection of the frame sealant on the substrate falls within or coincides with a projection of the curing energy transmissive layer on the substrate. Since the curing energy transmissive layer transparent for the curing energy beam is provided in the display substrate, the frame sealant can be irradiated with the curing energy beam from the display substrate side through the curing energy transmissive layer, instead of from the counter substrate side. This improves the efficiency for the curing energy beam to cure the frame sealant.

Unless otherwise defined, the technical or scientific terms used in the present disclosure shall have the general meanings understandable for those ordinarily skilled in the field of the present disclosure. The wordings such as "first", "second" or similar used in the description and claims of the present disclosure shall not represent any order, number or importance, but are used for distinguishing different elements. Similarly, the words such as "an", "a" or similar shall not represent limitation of numbers, but mean existence of at least one. The phrases "couple", "connect" or similar are not limited to physical or mechanical connection, but also include electrical connection, no matter directly or indirectly. The phrases "upper", "lower", "left", "right" and etc. shall be used only to represent relative positions, wherein, when the absolute position of the described object is changed, the relative positions may be changed accordingly.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A display substrate, comprising a display area and a peripheral area surrounding the display area, the display substrate is fixed to a counter substrate in the peripheral area by a frame sealant, wherein
   the display substrate comprises a substrate and a curing energy transmissive layer which is arranged on the substrate, wherein the curing energy transmissive layer is transparent for a curing energy beam and opaque for visible light,
   a projection of the frame sealant on the substrate falls within or coincides with a projection of the curing energy transmissive layer on the substrate, and
   a material of the frame sealant is different from a material of the curing energy transmissive layer.

2. The display substrate of claim 1, wherein
   the display substrate further comprises a light shielding component which is arranged in the peripheral area of the substrate; and
   a projection of the light shielding component on the substrate does not overlap the projection of the frame sealant on the substrate.

3. The display substrate of claim 2, wherein
the light shielding component and the curing energy transmissive layer are arranged on a surface of the substrate facing the counter substrate.

4. The display substrate of claim 2, wherein
the light shielding component is a light shielding frame.

5. The display substrate of claim 2, wherein
the light shielding component is a black matrix.

6. The display substrate of claim 5, wherein
the black matrix is provided with an opening part; and
the curing energy transmissive layer fills up the opening part.

7. The display substrate of claim 1, wherein
the curing energy transmissive layer comprises a material which is transparent for one of UV light and infrared light.

8. The display substrate of claim 1, wherein
the curing energy transmissive layer comprises a material which converts an incident energy beam into the curing energy beam.

9. The display substrate of claim 8, wherein
the curing energy transmissive layer comprises a material which converts an incident energy beam into a long wavelength energy beam for curing the frame sealant.

10. The display substrate of claim 8, wherein
the curing energy transmissive layer comprises a material which converts an incident energy beam into a short wavelength energy beam for curing the frame sealant.

11. A display panel, comprising:
the display substrate of claim 1; and
a counter substrate, wherein the counter substrate is assembled with the display substrate by the frame sealant.

12. The display panel of claim 11, wherein
the display substrate further comprises a color filter layer which is arranged on the substrate.

13. The display panel of claim 11, wherein
the counter substrate further comprises a thin film transistor layer and a color filter layer which is arranged on the thin film transistor layer.

14. A display device, comprising the display panel of claim 11.

15. A method for fabricating a display substrate, wherein the display substrate comprises a display area and a peripheral area and is fixed to a counter substrate in the peripheral area by a frame sealant, wherein the method comprises steps of:
preparing a substrate; and
forming a curing energy transmissive layer in the peripheral area of the substrate, wherein the curing energy transmissive layer is transparent for a curing energy beam and opaque for visible light, wherein a projection of the frame sealant on the substrate falls within or coincides with a projection of the curing energy transmissive layer on the substrate, and a material of the frame sealant is different from a material of the curing energy transmissive layer.

16. The method of claim 15, wherein the step of forming the curing energy transmissive layer comprises:
forming a black matrix on the substrate;
forming an opening part in the black matrix by a patterning process;
coating a dye in the opening part; and
drying the dye to form the curing energy transmissive layer.

17. The method of claim 15, wherein the step of forming the curing energy transmissive layer comprises:
forming a black matrix on the substrate;
forming an opening part in the black matrix by a patterning process; and
forming the curing energy transmissive layer in the opening part by deposition.

18. A method for fabricating the display panel of claim 11, comprises steps of:
forming a curing energy transmissive layer in the peripheral area of a substrate of the display substrate, wherein the curing energy transmissive layer is transparent for a curing energy beam and opaque for visible light;
coating a frame sealant on the display substrate or the counter substrate, wherein a projection of the frame sealant on the substrate falls within or coincides with a projection of the curing energy transmissive layer on the substrate; and
assembling the display substrate with the counter substrate and curing the frame sealant.

19. A display substrate, comprising a display area and a peripheral area surrounding the display area, the display substrate is fixed to a counter substrate in the peripheral area by a frame sealant, wherein
the display substrate comprises a substrate and a curing energy transmissive layer which is arranged on the substrate, wherein the curing energy transmissive layer is transparent for a curing energy beam and opaque for visible light, and the curing energy transmissive layer is arranged across the peripheral area and defines the display area,
a projection of the frame sealant on the substrate falls within or coincides with a projection of the curing energy transmissive layer on the substrate, and
a material of the frame sealant is different from a material of the curing energy transmissive layer.

20. A display substrate, comprising a display area and a peripheral area surrounding the display area, the display substrate is fixed to a counter substrate in the peripheral area by a frame sealant, wherein
the display substrate comprises a substrate, a curing energy transmissive layer and a color filter layer which are arranged on the substrate, wherein the curing energy transmissive layer is transparent for a curing energy beam and opaque for visible light,
a projection of the frame sealant on the substrate falls within a projection of the curing energy transmissive layer on the substrate, and area of the projection of the frame sealant on the substrate is smaller than area of the projection of the curing energy transmissive layer on the substrate, and
the curing energy transmissive layer contacts the color filter layer directly.

* * * * *